United States Patent [19]
Le

[11] Patent Number: 6,063,659
[45] Date of Patent: May 16, 2000

[54] METHOD OF FORMING A HIGH-PRECISION LINEAR MOS CAPACITOR USING CONVENTIONAL MOS DEVICE PROCESSING STEPS

[76] Inventor: Hung Pham Le, 2130 Shadow Ridge, San Jose, Calif. 95138

[21] Appl. No.: 08/923,810

[22] Filed: Sep. 4, 1997

Related U.S. Application Data

[63] Continuation of application No. 08/608,137, Feb. 28, 1996, abandoned.

[51] Int. Cl.[7] .................. H01L 27/04; H01L 21/8234
[52] U.S. Cl. ................ 438/250; 438/251; 438/252; 438/393; 438/395
[58] Field of Search ..................... 438/252, 395, 438/247, 250, 251, 393, 394, 381

[56] References Cited

U.S. PATENT DOCUMENTS

| | | | |
|---|---|---|---|
| 4,125,933 | 11/1978 | Baldwin | 438/395 |
| 4,427,457 | 1/1984 | Carlson | 438/395 |

FOREIGN PATENT DOCUMENTS

| | | | |
|---|---|---|---|
| 1-183146 | 7/1989 | Japan | 257/532 |
| 2-137256 | 5/1990 | Japan | 257/532 |
| 4-318964 | 11/1992 | Japan | 257/532 |

*Primary Examiner*—Mary Wilczewski
*Assistant Examiner*—Yung A. Lin
*Attorney, Agent, or Firm*—Burns Doane Swecker & Mathis L.L.P.

[57] ABSTRACT

A high-precision, linear MOS-transistor-gate capacitor device is provided by applying a source/drain high-energy, high-dose ion implantation through implant windows in a polysilicon top plate of the capacitor. The ion implantation may be a step of generic MOS source/drain process flow.

12 Claims, 1 Drawing Sheet

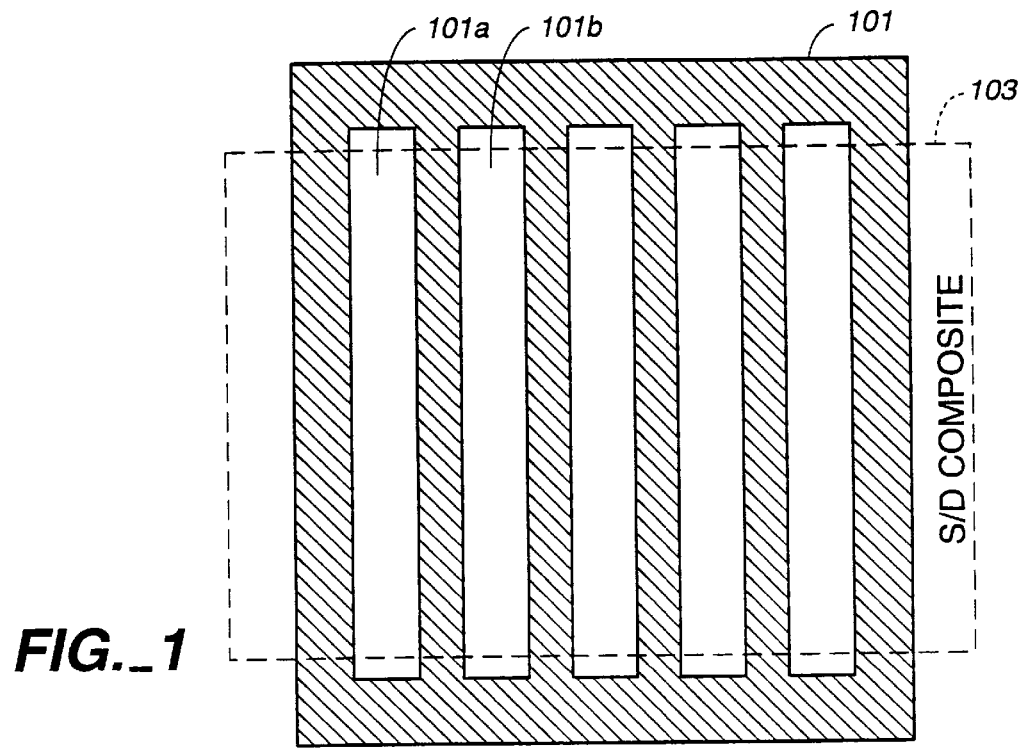
FIG._1
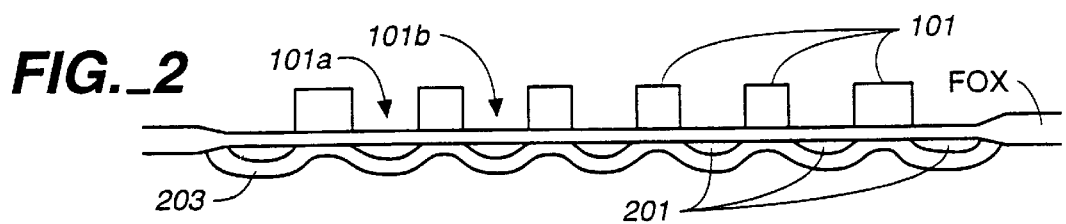
FIG._2
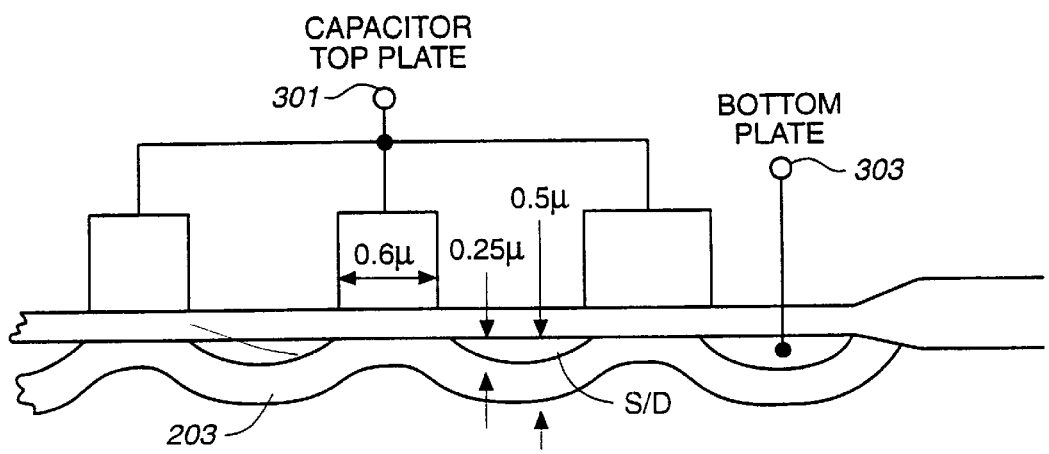
FIG._3

METHOD OF FORMING A HIGH-PRECISION LINEAR MOS CAPACITOR USING CONVENTIONAL MOS DEVICE PROCESSING STEPS

This application is a continuation of application Ser. No. 08/608,137, filed Feb. 28, 1996, now abandoned.

BACKGROUND OF THE INVENTION

1. Field of the Invention

The present invention relates to integrated circuit capacitor structures for MOS semiconductor processes.

2. State of the Art

In analog MOS designs, there is always a need for a high-precision, linear, bias-independent, low-impedance, high-unit-area capacitance, low-cost capacitor structure. The known MOS transistor-gate-to-well capacitor is readily available, therefore low-cost, and has high capacitance per unit area, but because of the nature of MOS capacitor, in which the silicon depletion layer modulates the capacitor, it is highly non-linear, bias-dependent, and therefore not high-precision. Current practice is to increase the doping level of the well near the silicon/oxide interface to reduce the depletion layer width, either by taking advantage of a special threshold voltage ("Vt") implant or having a "buried source/drain" implant prior to gate oxidation. A low Vt implant dosage (e.g., 10E12/cm2) is not sufficient to correct the linearity problem, and a buried source/drain (S/D) implant, which has a typical dosage of 10E15/cm2, results in a different, thicker MOS capacitor. Both of these options are generally not a part of a generic MOS process and add cost to manufacturing. What is needed, then, is a high-precision, linear MOS capacitor structure that can be produced as part of a generic MOS process. The present invention addresses this need.

SUMMARY OF THE INVENTION

The present invention, generally speaking, provides a high-precision, linear MOS-transistor-gate capacitor device by applying a source/drain high-energy, high-dose ion implantation through implant windows in a polysilicon top plate of the capacitor. The ion implantation may be a step of generic MOS source/drain process flow.

BRIEF DESCRIPTION OF THE DRAWING

The present invention may be further understood from the following description in conjunction with the appended drawing.

In the drawing:

FIG. 1 is a plan view of an MOS capacitor in accordance with the present invention;

FIG. 2 is a sectional view corresponding to the plan view of FIG. 1; and

FIG. 3 is an enlarged sectional view of the MOS capacitor of the present invention.

DETAILED DESCRIPTION OF THE PREFERRED EMBODIMENTS

The present MOS capacitor structure is designed to require only process steps normally required to form other MOS circuitry. During normal MOS processing, transistor wells are formed by creating a multiplicity of source-drain diffusions within a semiconductor substrate, usually silicon. For NMOS transistors, for example, the diffusions may be of any of a number of suitable impurities, such as arsenic (As), for example. A suitable insulating layer, of oxide for example, is deposited above the semiconductor substrate with the source-drain diffusions formed therein. Above the transistor wells, a relatively thin "gate oxide" layer is formed. Throughout the remainder of the integrated circuit, a relatively thick "field oxide" layer (FOX) is formed. Where a capacitor (or other structure) is to be formed, a thin oxide layer of comparable thickness as the usual gate oxide layer may be formed throughout an area encompassing multiple transistor wells. The term "source-drain composite" is used herein to refer to such an area.

To form a capacitor having the desirable characteristics set forth above, a conductive layer 101 such as highly-doped polysilicon is deposited above a source-drain composite 103 as shown in FIG. 1. The polysilicon layer forms the top plate of the capacitor. The bottom plate of the capacitor is formed in a manner to be presently described. However, unlike conventional capacitor structures having a polysilicon top plate, in the present capacitor structure, the polysilicon plate 101 is penetrated by windows 101a, 101b, etc., that allow for the bottom plate of the capacitor to be formed after the top plate of the capacitor, by ion implantation for example.

Normal MOS source/drain implantation (typical dose of 5E15/cm2) creates a heavily-doped region 201 (10E19–10E20/cm3) near the silicon/oxide interface, and some amount of dopant will laterally diffuse under the poly to create, in the case of an MOS transistor, adequate overlap (~0.1–0.2 um) necessary for MOS operation.

Referring to FIG. 2, a very linear MOS capacitor structure may be realized by using high-energy, high-dose implant within the region of a source/drain composite having sufficient source/drain areas 201 to achieve the desired capacitance, and by limiting the width of the poly plate between windows, such that sufficient lateral diffusion will occur to dope all areas heavily under the poly plate of the capacitor. The result is a continuous, highly-doped layer 203 underlying the source/drain composite 103 of FIG. 1.

The high-energy, high-dose implant can be a process option, but in some advanced technologies, it is already available and used to realize a deeper source/drain junction. One example is the ESD (Electro-Static Discharge) ion implantation used in sub-micron technologies. For example, an ESD implant recipe of phosphorus, 50 KeV, 5E15/cm2, will produce a junction depth of ~0.5 um and a lateral diffusion of ~0.4 um. Referring to FIG. 3, by designing the poly plate of the capacitor to have fingers of ~0.6 um in width, the highly-doped silicon layer 203 (under the poly fingers 101), which acts as the bottom plate of the capacitor, will be completely covered at the silicon/oxide surface by a lateral diffusion of phosphorus. The result is a MOS gate capacitor with the polysilicon as the top plate and a source/drain laterally-diffused junction as the bottom plate. Connection to the respective plates of the capacitor is made by leads 301 and 303.

Because of the heavy doping concentration of the polysilicon, (10E20/cm3) and the laterally-doped region (10E18–10E19/cm3), the capacitor is linear and high-precision. A very desirable feature of this approach is that the high-precision capacitor can be realized by taking advantage of an already-existing source/drain implant step (in this case ESD).

It will be appreciated by those of ordinary skill in the art that the invention can be embodied in other specific forms without departing from the spirit or essential character thereof. The foregoing description is therefore considered in all respects to be illustrative and not restrictive. The scope of the invention is indicated by the appended claims, and all changes which come within the meaning and range of equivalents thereof are intended to be embraced therein.

What is claimed is:

1. A method of forming an MOS capacitor on a semiconductor substrate, comprising the sequential steps of:
   a) diffusing impurities into the semiconductor substrate to form a MOS device source-drain composite region comprising a plurality of source-drain diffusions;
   b) forming a dielectric layer above the plurality of source-drain diffusions;
   c) forming a conductive layer above the dielectric layer;
   d) patterning the conductive layer so as to form openings therein, said openings being formed such that the plurality of source-drain diffusions are less than a predetermined distance from a closest opening in the conductive layer;
   e) implanting impurities into the source-drain composite region with a sufficient dosage and energy to diffuse the impurities laterally by the predetermined distance.

2. The method of claim 1 wherein the implanting step comprises implanting the impurities with an energy of at least 35 KeV and a dosage of at least 3.5E15/cm2.

3. The method of claim 1, wherein the implanting step forms a continuous doped layer having a doping concentration of at least 10E17/cm3.

4. The method of claim 1, wherein the step of forming a conductive layer comprises forming a polysilicon layer having a doping concentration of at least 10E19/cm3.

5. A method of forming an MOS capacitor on a semiconductor substrate, comprising the sequential steps of:
   a) diffusing impurities into the semiconductor substrate to form a MOS device source-drain composite region comprising a plurality of source-drain diffusions;
   b) forming a dielectric layer above the plurality of source-drain diffusions;
   c) forming a conductive layer above the dielectric layer;
   d) patterning the conductive layer so as to form openings therein, and
   e) implanting impurities into the source-drain composite region with a sufficient dosage and energy to diffuse the impurities laterally so as to form a continuous doped layer throughout the source-drain composite region.

6. The method of claim 5 wherein the implanting step comprises implanting the impurities with an energy of at least 35 KeV and a dosage of at least 3.5E15/cm2.

7. The method of claim 5, wherein the implanting step forms a continuous doped layer having a doping concentration of at least 10E17/cm3.

8. The method of claim 5, wherein the step of forming a conductive layer comprises forming a polysilicon layer having a doping concentration of at least 10E19/cm3.

9. A method of forming an MOS capacitor on a semiconductor substrate, comprising the sequential steps of:
   a) diffusing impurities into the semiconductor substrate to form a MOS device source-drain composite region comprising a plurality of source-drain diffusions;
   b) forming a dielectric layer above the plurality of source-drain diffusions;
   c) forming a conductive layer above the dielectric layer; and
   d) implanting impurities through windows in the conductive layer into the source-drain composite region with a sufficient dosage and energy to diffuse the impurities laterally by a predetermined distance.

10. The method of claim 9 wherein the implanting step comprises implanting the impurities with an energy of at least 35 KeV and a dosage of at least 3.5E15/cm2.

11. The method of claim 9, wherein the implanting step forms a continuous doped layer having a doping concentration of at least 10E17/cm3.

12. The method of claim 9, wherein the step of forming a conductive layer comprises forming a polysilicon layer having a doping concentration of at least 10E19/cm3.

* * * * *